United States Patent
Powell, Jr.

(10) Patent No.: US 9,620,953 B2
(45) Date of Patent: Apr. 11, 2017

(54) METHODS PROVIDING CONTROL FOR ELECTRO-PERMANENT MAGNETIC DEVICES AND RELATED ELECTRO-PERMANENT MAGNETIC DEVICES AND CONTROLLERS

(71) Applicant: WEN Technology, Inc., Raleigh, NC (US)

(72) Inventor: John W. Powell, Jr., Raleigh, NC (US)

(73) Assignee: WEN Technology, Inc., Raleigh, NC (US)

( * ) Notice: Subject to any disclaimer, the term of this patent is extended or adjusted under 35 U.S.C. 154(b) by 498 days.

(21) Appl. No.: 14/222,886

(22) Filed: Mar. 24, 2014

(65) Prior Publication Data
US 2014/0285930 A1    Sep. 25, 2014

Related U.S. Application Data

(60) Provisional application No. 61/804,820, filed on Mar. 25, 2013.

(51) Int. Cl.
| | |
|---|---|
| H02H 7/00 | (2006.01) |
| H01F 7/18 | (2006.01) |
| H01F 7/20 | (2006.01) |
| H02H 11/00 | (2006.01) |
| G01R 31/02 | (2006.01) |

(52) U.S. Cl.
CPC ............ *H02H 7/00* (2013.01); *G01R 31/025* (2013.01); *H01F 7/18* (2013.01); *H01F 7/206* (2013.01); *H02H 11/005* (2013.01); *H01F 2007/208* (2013.01)

(58) Field of Classification Search
CPC .................................. H02H 7/00; H01F 7/064
USPC ...................................................... 361/47, 139
See application file for complete search history.

(56) References Cited

U.S. PATENT DOCUMENTS

| | | | |
|---|---|---|---|
| 4,507,635 | A | 3/1985 | Cardone et al. |
| 4,847,582 | A | 7/1989 | Cardone et al. |
| 5,822,243 | A | 10/1998 | Shone |
| 5,888,120 | A | 3/1999 | Doran |
| 5,989,103 | A | 11/1999 | Birang et al. |
| 6,050,882 | A | 4/2000 | Chen |
| 6,183,342 | B1 | 2/2001 | Watanabe et al. |
| 6,213,855 | B1 | 4/2001 | Natalicio |
| 6,292,078 | B1 | 9/2001 | Cardone et al. |
| 6,325,696 | B1 | 12/2001 | Boggs et al. |
| 6,354,928 | B1 | 3/2002 | Crevasse et al. |

(Continued)

FOREIGN PATENT DOCUMENTS

| | | |
|---|---|---|
| JP | 62094257 | 4/1987 |
| JP | 8-155831 | 6/1996 |

*Primary Examiner* — Dharti Patel
(74) *Attorney, Agent, or Firm* — Sage Patent Group

(57) ABSTRACT

Methods may be provided to control an electro-permanent magnetic device powered from an AC mains power source provided through first and second power lines of a controller, wherein a first switch is provided on the first power line between the AC mains power source and the electro-permanent magnetic device and a second switch is provided on the second power line between the AC main power source and the electro-permanent magnetic device. In particular, a sequence of switching pulses may be transmitted through the first and second switches to change a magnetic state of the electro-permanent magnetic device. Related controllers are also discussed.

35 Claims, 10 Drawing Sheets

De-Magnetized

Magnetized

(56) References Cited

U.S. PATENT DOCUMENTS

| | | |
|---|---|---|
| 6,436,828 B1 | 8/2002 | Chen et al. |
| 6,592,434 B1 | 7/2003 | Vanell et al. |
| 6,719,615 B1 | 4/2004 | Molnar |
| 6,899,607 B2 | 5/2005 | Brown |
| 7,066,785 B2 | 6/2006 | Park et al. |
| 7,999,645 B2 | 8/2011 | Sarda |
| 2003/0174457 A1* | 9/2003 | Herbst .................. H01H 9/563 361/170 |

* cited by examiner

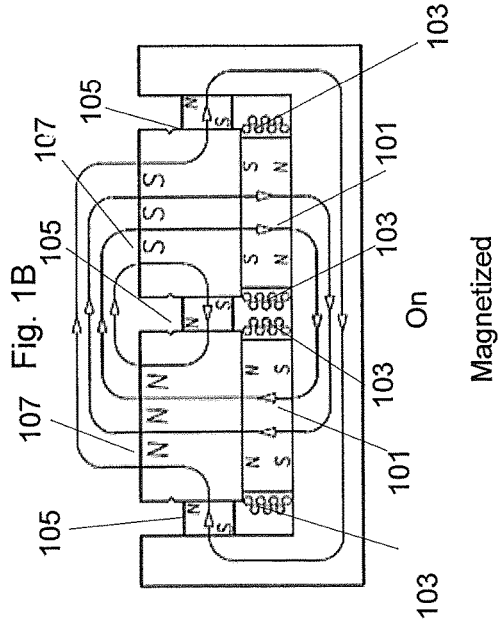
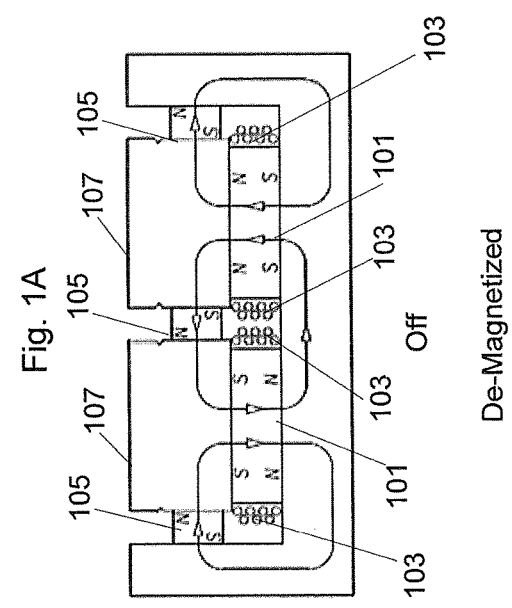
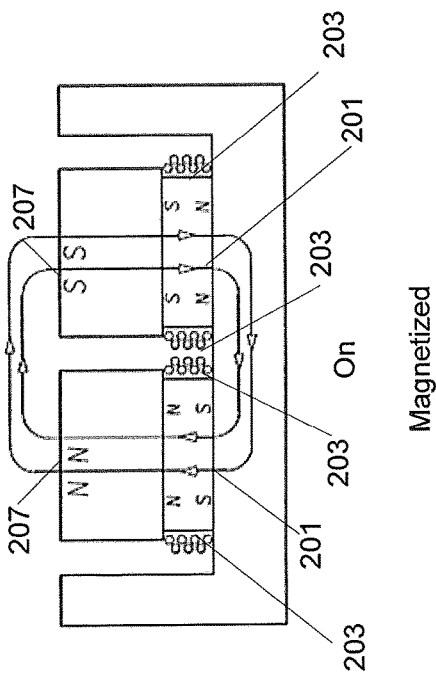
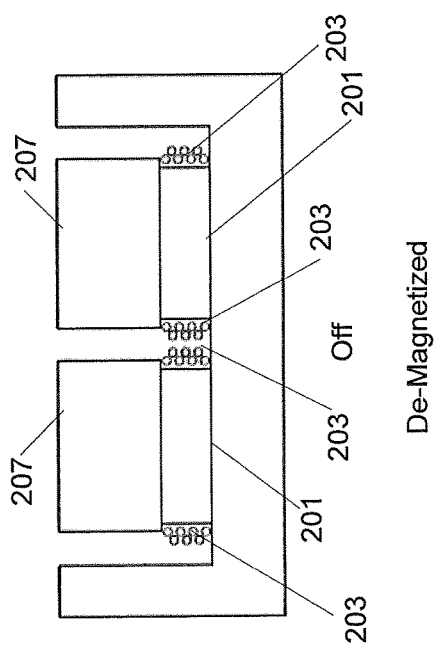

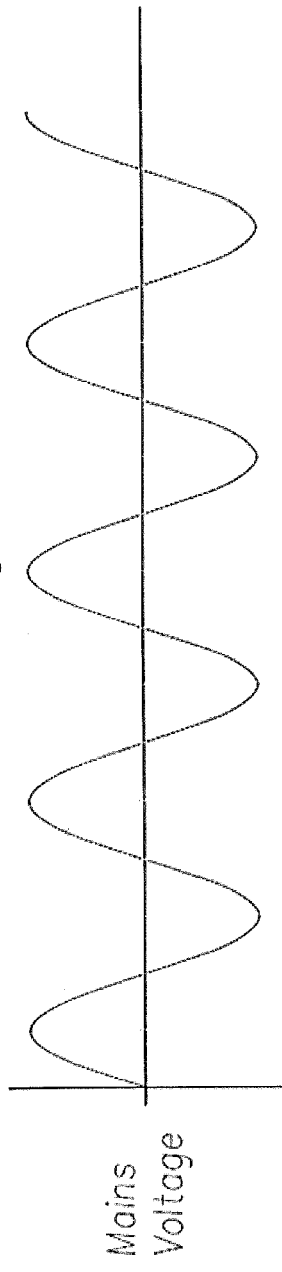
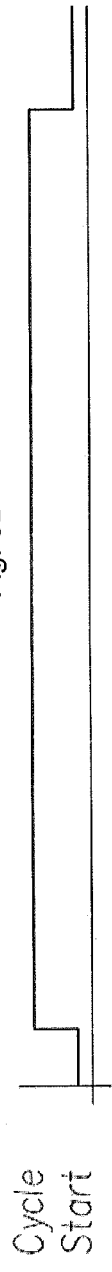
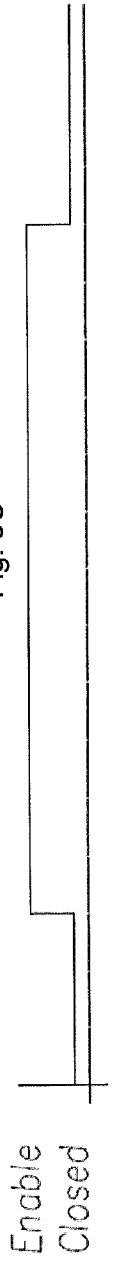
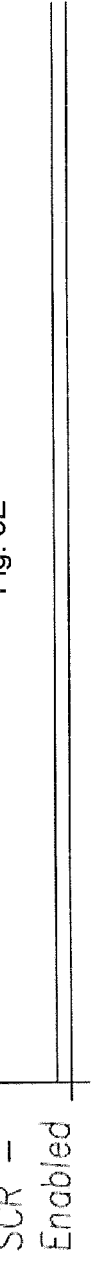
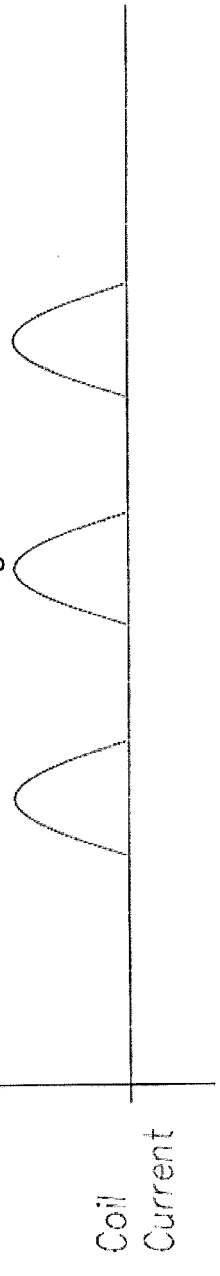

METHODS PROVIDING CONTROL FOR ELECTRO-PERMANENT MAGNETIC DEVICES AND RELATED ELECTRO-PERMANENT MAGNETIC DEVICES AND CONTROLLERS

RELATED APPLICATION

The present application claims the benefit of priority from U.S. Provisional Application No. 61/804,820 filed Mar. 25, 2013, the disclosure of which is hereby incorporated herein in its entirety by reference.

BACKGROUND

The present disclosure is directed to electro-permanent magnetic devices, and more particular to methods of controlling power to electro-permanent magnetic devices and related controllers.

Electro-permanent magnetic devices are used in industrial systems, for example, to magnetically clamp objects securely without fear of loss of magnetic clamping force due to power failures. Applications include holding workpieces during machining, holding dies/molds in presses, lifting, transporting, etc.

The magnetic circuit of an electro-permanent magnetic device includes an electro-permanent magnet that can be electrically switched between On (magnetized) and Off (de-magnetized) states, and once in either state, no further electrical energy is required to maintain the electro-permanent magnet in that state. Once energized, the electro-permanent magnet can thus be disconnected from electrical power indefinitely without losing magnetic clamping power.

The ability to disconnect an electro-permanent magnetic device from power without losing magnetic clamping power is valuable because it allows a part to be loaded on an electro-permanent magnetic chuck, and then the chuck can be disconnected from power and moved through multiple processing stations without the need of an electrical connection being maintained with the chuck and without fear of losing holding power.

FIGS. 1A-B and 2A-B illustrate examples of circuits of electro-permanent magnetic devices. The DM (double magnet) circuit of FIGS. 1A and 1B uses two types of magnets, a switching magnet including a switching magnetic material (having relatively low coercivity) 101 and a coil 103 (used to switch a magnetic state of the switching magnetic material 101 responsive to an electrical current through the coil 103) and a non-switching magnet including a non-switching magnetic material (having relatively high coercivity) 105. The DM circuit is switched by changing the state (i.e., polarity) of the switching magnetic material 101 such that magnetic energy is either trapped inside the unit in a de-magnetized or off state as shown in FIG. 1A or pushed out through the poles 107 to clamp a component in a magnetized or on state as shown in FIG. 1B. While not shown in cross section in FIGS. 1A and 1B, an electro-permanent magnetic device may include a two-dimensional array of switching magnets (including switching magnetic material 101 and coil 103), non-switching magnets (including non-switching magnetic material 105), and pole pieces 107. Moreover, the coils 103 of the switching magnets may be electrically coupled in series or in parallel, with a controller providing electrical current through the coils 103 to switch the switching magnets on and off. In the DM circuit of FIGS. 1A and 1B, the switching magnets are switched between on in a first polarity to offset the magnetic force of non-switching magnets 105 (e.g., as shown in the de-magnetized off state of FIG. 1A) and on in a second polarity (opposite the first polarity) to add to the magnetic force of the non-switching magnets 105 (e.g., as shown in the magnetized on state of FIG. 1B).

The SM (single magnet) circuit of FIGS. 2A and 2B omits the non-switchable magnets and switches the switchable magnets 201 on (magnetized) and off (de-magnetized) in a manner similar to that discussed above with respect to FIGS. 1A and 1B. In the SM circuit of FIGS. 2A and 2B, however, the switchable magnets are switched between off (demagnetized) and on (magnetized). The SM circuit of FIGS. 2A and 2B switches off by actually using the coil 203 to de-magnetize the switching magnetic material 201. When switched off, the switching magnets 201 may be substantially demagnetized as shown in FIG. 2A, and when switched on, magnetic energy from the switching magnets 201 may be pushed out through the poles 207 as shown in FIG. 2B.

Devices using switching magnets are discussed, by way of example, in U.S. Pat. No. 7,999,645, in U.S. Pat. No. 6,292,078, in U.S. Pat. No. 4,847,582, and in U.S. Pat. No. 4,507,635, the disclosures of which are hereby incorporated herein in their entireties by reference.

Both DM circuits and SM circuits can use a same or similar control technology, with a difference being that the Off cycle for the SM circuit may be longer and/or more complex involving a diminishing +/− sequence of firing pulses to demagnetize the switching magnetic material.

Two basic options to control these magnetic systems include DC rectified control and AC chopped wave "impulse magnetizer" control. AC impulse magnetizer control is most commonly used in industry. Very large systems may be difficult to manage using AC impulse magnetizer control, however, and DC rectified control techniques may be used instead. Currently, many applications may use AC impulse magnetizer control techniques.

In both DM and SM circuits, relatively high voltages and/or currents may thus be used to switch the switching magnets to provide the magnetized (on) and de-magnetized (off) states of electro-permanent magnetic devices. The use of such high voltages/currents in harsh operating environments (e.g., including the presence of metal shavings, cooling liquids, etc.) may increase a risk of an electrical short circuit. Accordingly, control systems that reduce risk of damage and/or injury resulting from electrical shorts (e.g., to ground, between phases, etc.) and/or uncontrolled current flow during magnetic switching operations may be useful.

SUMMARY

According to some embodiments of inventive concepts, methods may be provided to control an electro-permanent magnetic device powered from an AC mains power source provided through first and second power lines of a controller, wherein a first switch is provided on the first power line between the AC mains power source and the electro-permanent magnetic device and a second switch is provided on the second power line between the AC main power source and the electro-permanent magnetic device. More particularly, a sequence of switching pulses may be transmitted through the first and second switches to change a magnetic state of the electro-permanent magnetic device.

For example, the first switch may include a first semiconductor switch, and/or the second switch may include a second semiconductor switch or a mechanical switch.

Before transmitting the sequence of switching pulses, the first and second switches may be turned on for at least one test pulse having a duration less than that of one of the switching pulses to test for a short circuit between outputs of the first and second switches. Transmitting the sequence of switching pulses through the first and second switches may thus include transmitting the sequence of pulses responsive to the test indicating an absence of short circuits. Turning the first and second switches on for at least one test pulse may include turning the first switch on for a plurality of test pulses of increasing duration. Responsive to the test indicating a presence of a short circuit, a breaker may be opened between the AC mains voltage source and each of the first and second switches, and the switching pulses may be aborted.

Before transmitting the sequence of switching pulses, a relay may be opened between the AC mains power supply and the first and second switches. Before transmitting the sequence of switching pulses, an absence of voltage on a coil side of the relay may be checked while the relay is open. Before transmitting the sequence of switching pulses, the relay may be closed responsive to checking for the absence of voltage on the coil side of the relay.

While transmitting the sequence of switching pulses, an imbalance of current between the first and second power lines of the controller may be monitored for. Responsive to detecting a imbalance of current, a breaker may be opened between the AC mains voltage source and each of the first and second switches, and the switching pulses may be aborted.

While transmitting the sequence of switching pulses, current through one of the first and second power lines of the controller may be monitored for between switching pulses. Responsive to detecting current between switching pulses, a breaker may be opened between the AC mains voltage source and each of the first and second switches, and the switching pulses may be aborted.

One of the first and second power lines of the controller may be a common voltage line, and the other of the first and second voltage lines may be a positive voltage line.

The first switch may be a first semiconductor controlled rectifier (SCR), and/or the second switch may be a second semiconductor controlled rectifier. More particularly, the first switch may include a first positive semiconductor controlled rectifier for positive pulses and a first negative semiconductor controlled rectifier for negative pulses, and/or the second switch may include a second positive semiconductor controlled rectifier for positive pulses and a second negative semiconductor controlled rectifier for negative pulses.

Before transmitting the sequence of switching pulses, the first switch may be turned on to test the for a ground fault, and transmitting the sequence of switching pulses through the first and second switches may include transmitting the sequence of switching pulses responsive to the test indicating an absence of ground faults. Turning the first switch on to test for a ground fault may include turning the first switch on to test for the ground fault while maintaining the second switch off. Turning the first switch on may include pulsing the first switch to provide a plurality of successive voltage test pulses of increasing duration through the first switch. Responsive to the test indicating the presence of a ground fault, a breaker may be opened between the AC mains voltage source and each of the first and second switches, and the switching pulses may be aborted.

According to some other embodiments of inventive concepts, a controller may be provided for an electro-permanent magnetic device powered from an AC mains power source. The controller may include first and second power lines, a first switch on the first power line between the AC mains power source and the electro-permanent magnetic device, a second switch on the second power line between the AC mains power source and the electro-permanent magnetic device, and a processor coupled to the first and second switches. The processor may be configured to control the first and second switches so that a sequence of switching pulses is transmitted through the first and second switches to change a magnetic state of the electro-permanent magnetic device.

The first switch may include a first semiconductor controlled rectifier, and/or the second switch may include a second semiconductor controlled rectifier. The first switch may include a first positive semiconductor controlled rectifier for positive pulses and a first negative semiconductor controlled rectifier for negative pulses. The second switch may include a second positive semiconductor controlled rectifier for positive pulses and a second negative semiconductor controlled rectifier pulse for negative pulses.

The processor may be further configured to control the first and second switches to turn on the first and second switches for at least one test pulse having a duration less than that of one of the switching pulses before transmitting the sequence of switching pulses to test for a short circuit between outputs of the first and second switches. The processor may also be configured to control the first and second switches to transmit the sequence of switching pulses through the first and second switches responsive to the test indicating an absence of short circuits. The processor may be further configured to turn the first and second switches on for at least one test pulse by turning the first switch on for a plurality of test pulses of increasing duration. In addition, a breaker may be provided between the AC mains voltage source and each of the first and second switches, and the processor may be further configured to open the breaker and abort the switching pulses responsive to the test indicating a presence of a short circuit.

A relay may be provided between the AC mains power supply and the first and second switches. The processor may be further configured to open the relay before transmitting the sequence of switching pulses, to check for an absence of voltage on a coil side of the relay while the relay is open before transmitting the sequence of switching pulses, and to close the relay responsive to checking for the absence of voltage on the coil side of the relay before transmitting the sequence of switching pulses.

A breaker may be provided between the AC mains voltage source and each of the first and second switches. The processor may be further configured to monitor for an imbalance of current between the first and second power lines of the controller while transmitting the sequence of switching pulses, and to open the breaker and abort the switching pulses responsive to detecting a imbalance of current.

A breaker may be provided between the AC mains voltage source and each of the first and second switches. The processor may be further configured to monitor for current through one of the first and second power lines of the controller between switching pulses while transmitting the sequence of switching pulses, and to open a breaker between the AC mains voltage source and each of the first and second switches and abort the switching pulses responsive to detecting current between switching pulses.

One of the first and second power lines of the controller may be a common voltage line and the other of the first and second voltage lines may be a positive voltage line.

The processor may be further configured to turn the first switch on to test the for a ground fault before transmitting the sequence of switching pulses, and to control the first and second switches to transmit the sequence of switching pulses responsive to the test indicating an absence of ground faults. The processor may be configured to turn the first switch on to test for a ground fault by turning the first switch on to test for the ground fault while maintaining the second switch off. The processor may be configured to turn the first switch on by pulsing the first switch to provide a plurality of successive test pulses of increasing duration through the first switch. In addition, a breaker may be provided between the AC mains voltage source and each of the first and second switches, and the processor may be configured to open the breaker and abort the switching pulses responsive to the test indicating the presence of a ground fault.

BRIEF DESCRIPTION OF THE DRAWINGS

The accompanying drawings, which are included to provide a further understanding of the disclosure and are incorporated in and constitute a part of this application, illustrate certain non-limiting embodiments of inventive concepts. In the drawings:

FIGS. 1A and 1B are cross sectional views illustrating a double magnet circuit in de-magnetized and magnetized states respectively;

FIGS. 2A and 2B are cross sectional views a single magnet circuit in de-magnetized and magnetized states respectively;

FIGS. 3A, 3B, 3C, 3D, 3E, and 3F are signal/timing diagrams illustrating signals used to control power to an electro-permanent magnet module according to some embodiments;

DETAILED DESCRIPTION

Inventive concepts will now be described more fully hereinafter with reference to the accompanying drawings, in which examples of embodiments of inventive concepts are shown. Inventive concepts may, however, be embodied in many different forms and should not be construed as limited to the embodiments set forth herein. Rather, these embodiments are provided so that this disclosure will be thorough and complete, and will fully convey the scope of inventive concepts to those skilled in the art. It should also be noted that these embodiments are not mutually exclusive. Components from one embodiment may be tacitly assumed to be present/used in another embodiment.

Figure 4:
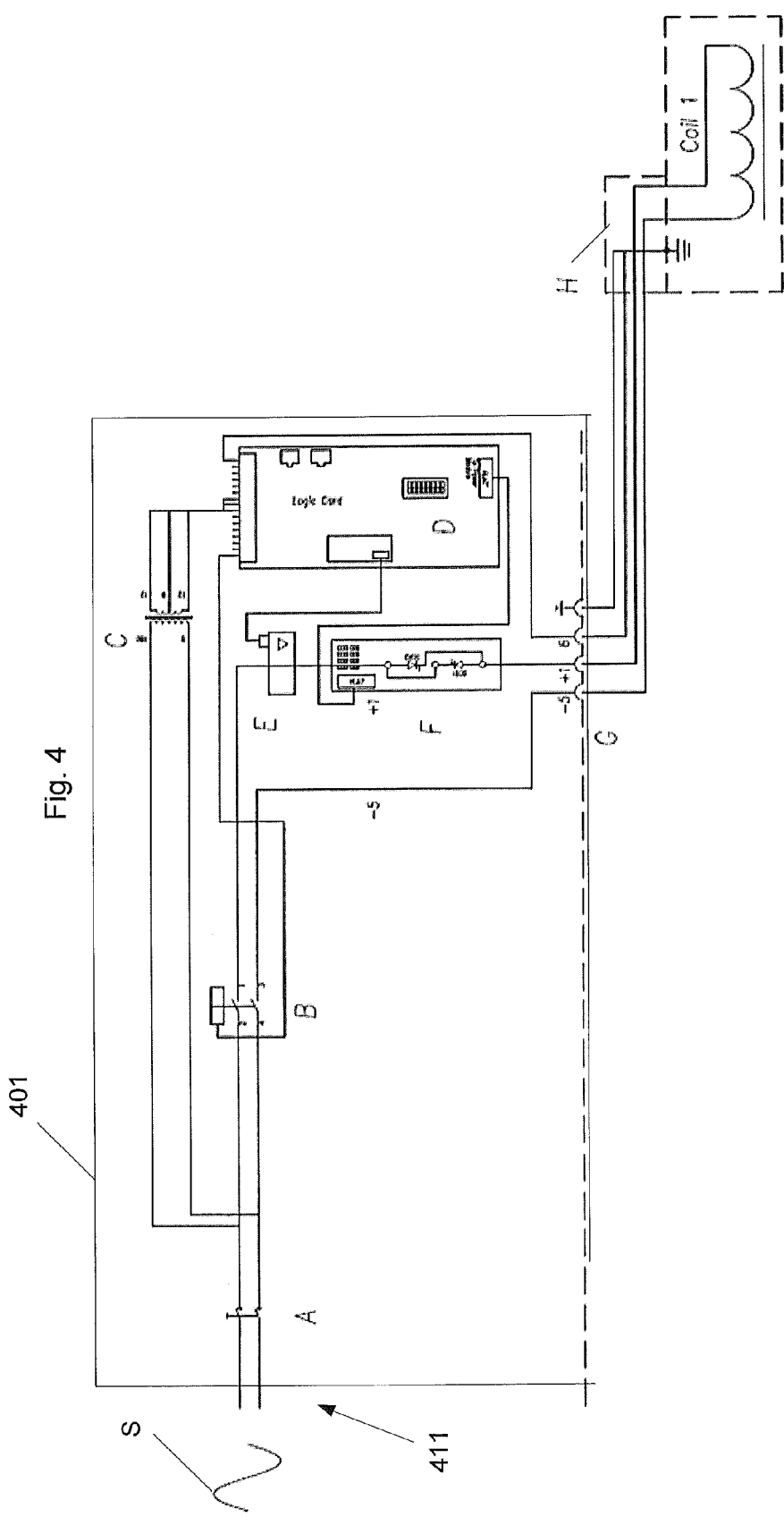
FIGS. 4, 5, and 6 are schematic diagrams illustrating elements of controllers for electro-permanent magnetic devices and examples of failure mechanisms according to some embodiments.

Switching of switching magnets using current pulses through the switching magnet coil(s) is illustrated in the timing/signal diagrams of FIGS. 3A to 3F and the control circuit of FIG. 4. As shown in FIG. 4, a controller 401 may be provided between the AC mains power source S and an electro-permanent magnet module H (e.g., an electro-permanent magnet chuck), with a single coil used to schematically represent one or more serially/parallel coupled coils used to switch one or more switching magnets. Elements of AC impulse magnetizing controller 401 of FIG. 4 may include: a coupling 411 to the single-phase AC mains power source S; a manual on/off disconnect switch A; a mechanical contactor B (also referred to as enable relay B) to provide galvanic isolation between the control output and AC power mains source S; a control transformer C to power logic card D and services; a logic card D (also referred to as a processor, micro-controller, etc.); a current detector E providing feed-back to the logic card D; an SCR bridge F (also referred to as a switch or a semiconductor switch) controlled from the logic card D to allow current to flow as desired; a detachable cable with connector G (also referred to as a cable) going to the electro-permanent magnet module H (e.g., a magnetic workholding chuck).

FIGS. 3A to 3F are timing/switching diagrams illustrating a switching cycle that may be used by controller 401 to magnetize/de-magnetize electro-permanent magnet module H. The controller 401 is initially powered ON by closing the disconnect switch A while maintaining the enable relay B in the open state so that AC mains power (shown in FIG. 3A) is provided through control transformer C to logic card D without providing AC mains power to SCR bridge F or connector G. A logic high level of a cycle command (labeled cycle start in FIG. 3B) is received and the magnetizing/demagnetizing cycle commences. Enable relay B is closed responsive to a logic high level of the enable closed signal of FIG. 3C generated by logic card D thereby providing AC mains voltage to the output side of the controller with the SCR (silicon controlled rectifier) bridge F blocking current flow to the electro-permanent magnet module H. To magnetize the electro-permanent module H, the logic card D may then send a sequence of "SCR+Enabled" signal pulses as shown in FIG. 3D to the SCR bridge F telling it to allow positive half wave pulses of AC mains power to flow through a positive SCR of the SCR bridge F to the coil as shown in FIG. 3F without sending "SCR−Enabled" signal pulses to the SCR bridge F to block negative half wave pulses of AC mains power through a negative SCR of the SCR bridge F as shown in FIG. 3E. To de-magnetize the electro-permanent module H, the logic card D may then send a sequence of "SCR−Enabled" signal pulses to the SCR bridge F telling it to allow negative half wave pulses of AC mains power to flow through a negative SCR of the SCR bridge F to the coil without sending "SCR+Enabled" signal pulses to the positive SCR of the SCR bridge F to block positive half wave pulses of AC mains power through the positive SCR of the SCR bridge F. Current detector E checks that current flows correctly while providing the current pulses used to magnetize/demagnetize the electro-permanent magnet module H. Once the pulse sequence is completed (i.e., the SCR bridge F terminates current pulses through the coil as shown in FIGS. 3D and 3F), the enable relay B is opened (responsive to the enable closed signal going to the low logic level as shown in FIG. 3C), and the cycle is complete.

Electro-permanent magnetic systems powered by impulse magnetizers as described above with respect to FIGS. 3A to 3F and 4, however, may be subject to dramatic failure as discussed in greater detail below.

The coil(s) of electro-permanent magnet module H may be very highly stressed, and thermal failure may occur in an extremely short period of time if subjected to continuous full wave current (e.g., due to a ground fault, SCR failure, etc.). These systems may be used in harsh industrial machining environments with large amounts of metal chips present, with high pressure coolant blasting on them, and/or with operators manually plugging and unplugging the cable G. While many jurisdictions require ground fault protection on all industrial machinery, others do not and, in these jurisdictions, ground fault protection may not be provided. Components used in electro-permanent magnetic device controls may be undersized compared with the peak electrical currents that they deliver. For example, continuous current ratings of some components may be one-tenth to one twentieth of actual peak design currents that will be experienced in normal operation. Because of the high stress on the controller and coil components, traditional fuses in the incoming supply may not reliably protect the controller or coils.

Figure 5:
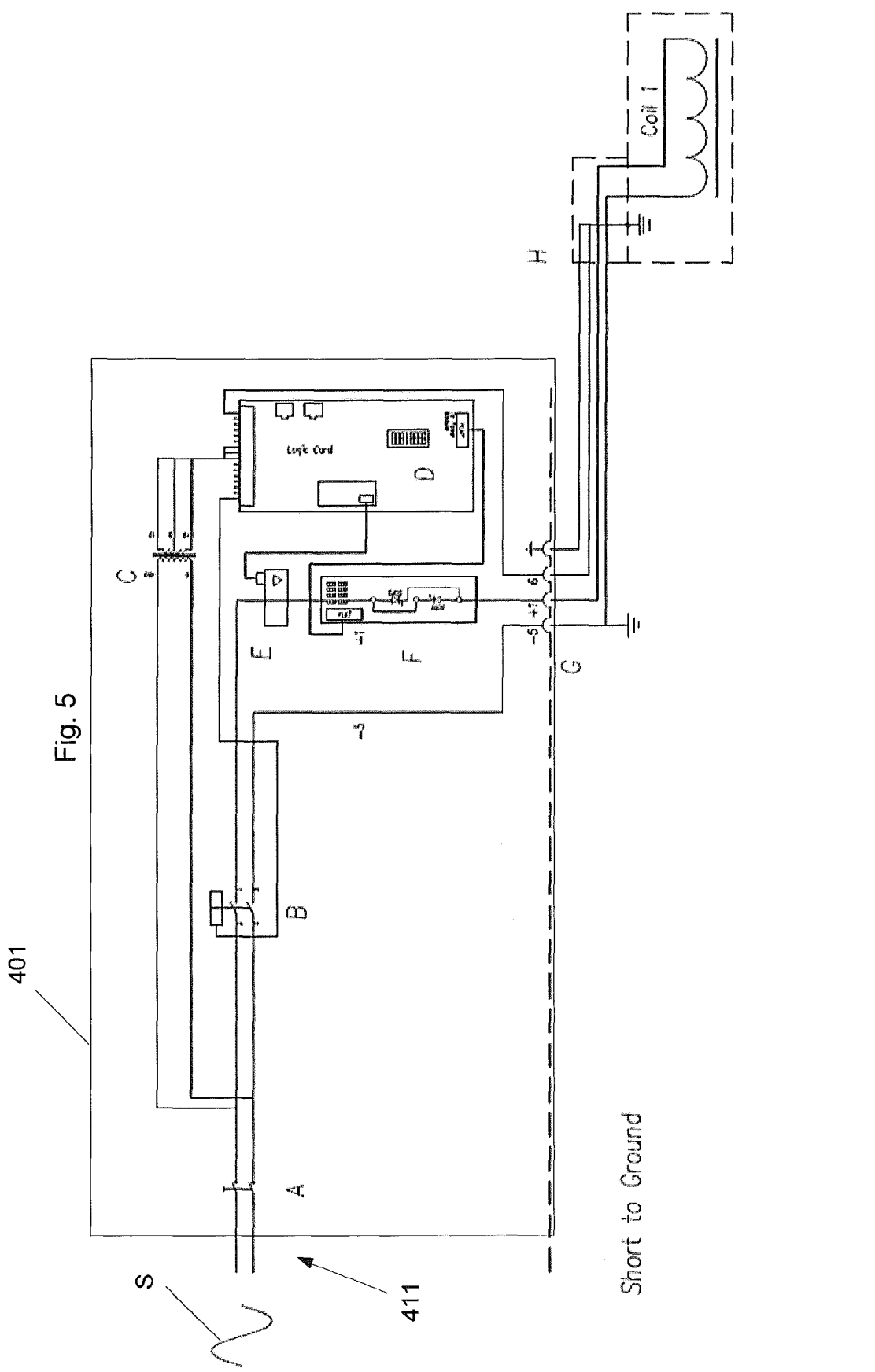

FIG. 5 shows an example of a failure situation with a direct short to ground on the common (un-regulated) line. This may result from coolant or metal chips in the connector and may happen part way through a firing sequence due to magnetic influences and/or arc-flash.

In the case of FIG. 5, the mechanical enable relay B will try to open under a potentially infinite current condition, and it will almost certainly arc and weld (probably in the closed condition so that AC mains voltage remains present). Once welded, enable relay B will not open. Once enable relay B is welded, there is the potential for continuous current to flow to the coil that will destroy the coil. Once the coil is damaged/destroyed, it may be difficult/impossible to release the magnet.

Figure 6:
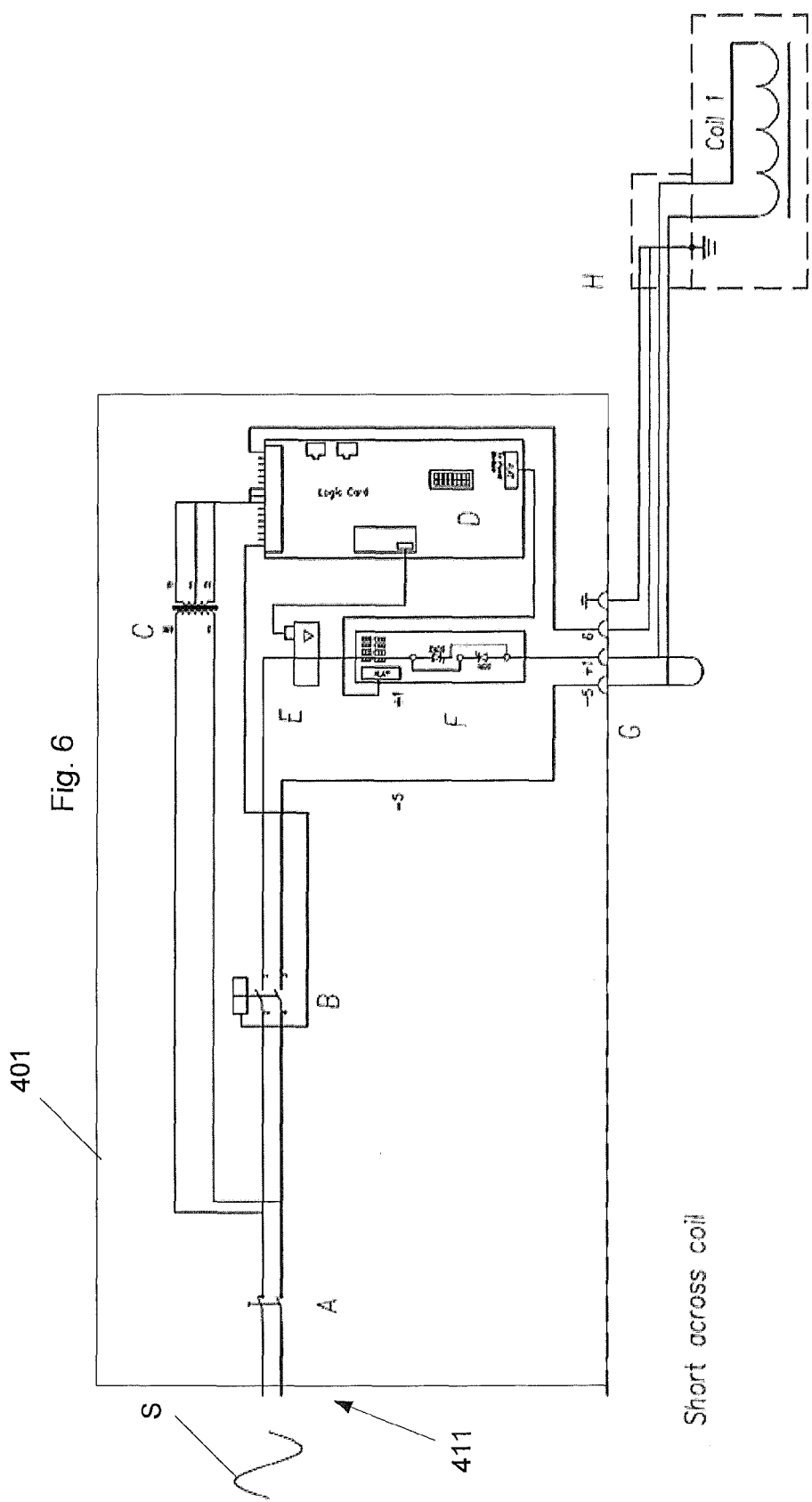

FIG. 6 shows another failure scenario where there is a direct short across the coil (i.e., between the positive and common phases of cable G) which can result in uncontrolled current flow through SCR bridge F. If the SCR bridge F fails in a short-circuit condition, then the enable relay B will almost certainly weld since it will try to open under excessive current conditions. All control of the situation may then be lost, and the AC mains fuses may be all that is left to protect from further damage or injury. In this situation, unregulated current may continue to flow until the upstream AC mains circuit fuses blow, and this may take 10's of seconds. In this situation, it is also possible that the coils inside the magnet may be damaged so that releasing the magnet may be difficult/impossible.

Also, once the enable relay B welds to a closed state, there is a direct path from the AC mains power supply to the common pin on the connector. If the system uses a quick disconnect, there will be voltage on the connector resulting in a risk of shock and/or arc flash for an operator handling the connector.

Figure 7:
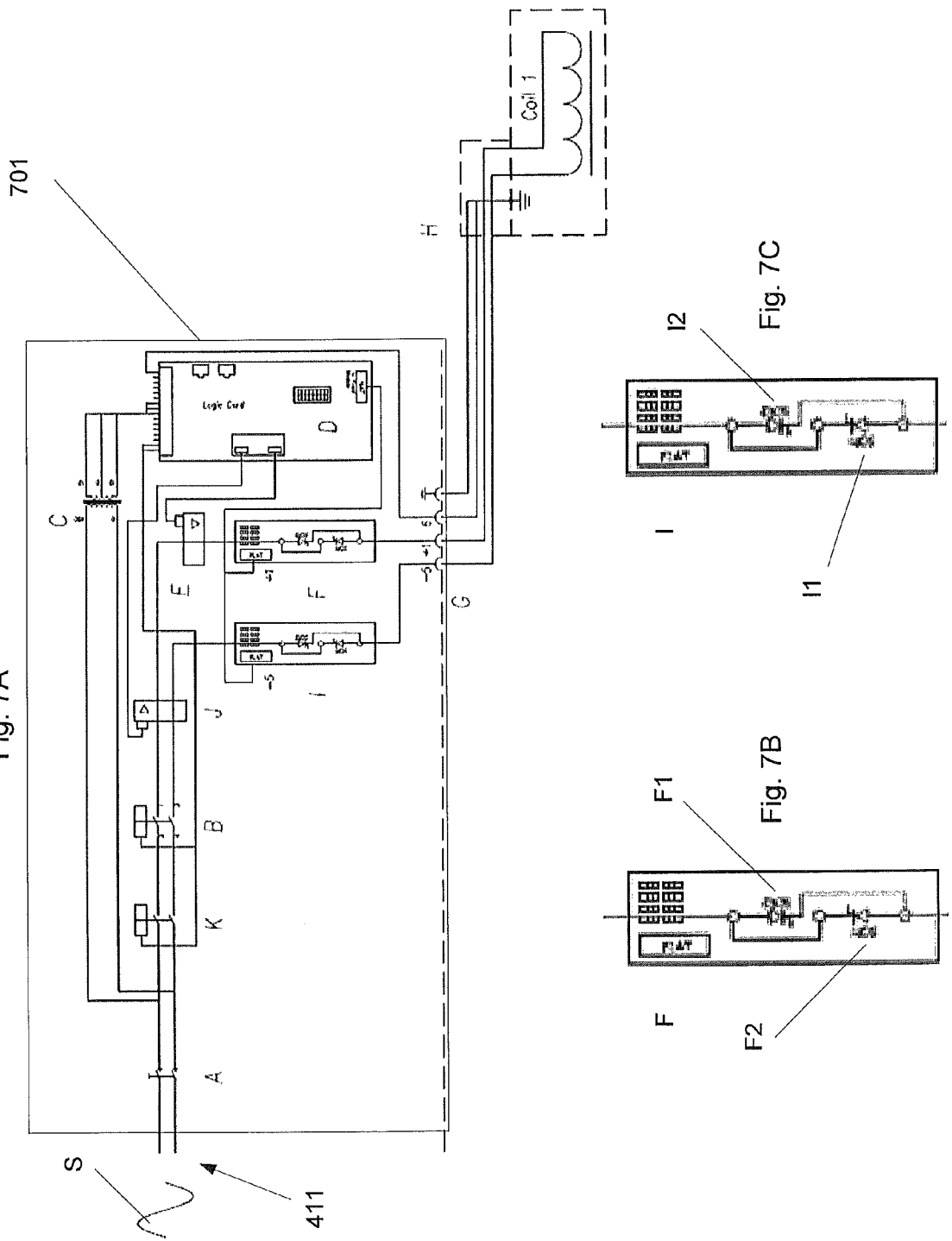
FIGS. 7A, 7B, and 7C are schematic diagrams illustrating elements of controllers for electro-permanent magnetic devices according to some embodiments.

Embodiments of present inventive concepts may address/reduce problems relating to the potential failures discussed above. Referring to FIG. 7A, three components are added to controller 701 relative to the control circuits discussed above with respect to FIGS. 4, 5, and 6.

The first component is SCR bridge I (also referred to as a switch or a semiconductor switch) that operates synchronously with SCR bridge F (but in reverse) to create continuity with SCR control on both the positive +1(+2, +3 . . . +n) and common −5 sides of the power feed to module H when magnetizing/de-magnetizing electro-permanent magnet module H. As shown in FIGS. 7A-C, each SCR bridge F and I includes two silicon controlled rectifiers (SCRs) arranged in opposite directions. As shown in greater detail in FIGS. 7B and 7C, a first SCR F1 of bridge F and a first SCR I1 of bridge I are used synchronously (firing at the same time responsive to the SCR+enabled signals of FIG. 3) to provide switching pulses of a first polarity (e.g., a positive polarity as shown by the coil current of FIG. 3) used to magnetize module H, and a second SCR F2 of bridge F and a second SCR I2 of bridge I are used to provide switching pulses of a second polarity different than the first polarity (e.g., a negative polarity) to de-magnetize module H. In examples of switching discussed below, only SCRs F1 and I1 are discussed providing positive switching pulses used to switch module H to a first state, but the same operations apply in reverse with respect to SCRs F2 and I2 providing negative pulses to switch module H to a second state (opposite the first state).

When switching to the first state, SCRs F1 and I1 are the active SCRs used to switch current to module H, and SCRs F2 and I2 are inactive (i.e., maintained in the open/non-conductive state throughout the switching operation). At the start of a switching cycle, both active SCR's F1 and I1 (as well as inactive SCRs F2 and I2) are open so that the enable relay B closes in a positive "zero current" situation responsive to the enable closed signal of FIG. 3C. This reduces/eliminates the possibility of "arc-flash" welding of contacts of enable relay B, and places supervision of current flow to the coil of module H under the control of the active SCR's F1 and I1 which may be less prone to failure from instantaneous high current bursts. When switching to the second state, SCRs F2 and I2 are the active SCRs used to switch current to module H responsive to the SCR−enabled signal, and SCRs F1 and I1 are inactive (i.e., maintained in the open/non-conductive state throughout the switching operation).

The second component is current detector J used in a "ground-fault detection" mode with both AC power mains phases passing therethrough. A ground fault condition at any time during the firing cycle may be quickly/immediately detected by current detector J. The magnetic fields of balanced currents through the opposite phases of the AC power mains offset each other so that current detector J does not detect current. If a ground fault occurs, however, the magnetic fields of the resulting unbalanced currents will be detected by the current detector, and this detected current is identified as a ground fault. An output of current detector J is used to notify logic card D of any such ground fault.

The third component is a magneto-thermic supplementary breaker with shunt-trip module K (also referred to as breaker K) placed across the AC power mains anywhere between the AC power mains input and the cable G. By way of example, the breaker K may be placed across the AC power mains between the taps for supply transformer C (that powers the logic card D) and the cable G, or more particularly, between the taps for supply transformer C and enable relay B. The magneto-thermic portion of breaker K is sized to trip under excessive current conditions (i.e., when more current flows than the controller is designed to handle) so that, under normal operation, breaker K should never self-trip. The shunt-trip portion of breaker K allows the logic card D to actively trip breaker K in a relatively rapid/instantaneous manner in the event of a detected problem (e.g., a ground fault, improper voltage on coil side of enable relay, short circuit across the coils, or unwanted current flow). The magneto-thermic device (breaker K) is designed to self trip under high current conditions without welding, and it thus provides a reliable and secure way to isolate downstream components from AC mains power S. With these components in place, logic board D can be used to implement the following operations:

Start of cycle–the enable relay B and both active SCR's F1 and I1 (SCRs of SCR bridges F and I on the positive and common controller power lines) are Open so that no current can pass, and there are two independent barriers between the AC mains power and the output of controller 701 at connector/cable G.

First, grounding of line 6 on the output connector/cable G to the coil is checked to ensure that the discharge cable is properly attached to the electro-permanent magnet module H. If line 6 is not grounded, then the switching cycle is aborted to reduce/prevent a possibility of voltage on the cable while handling.

Second, the mechanical enable relay B is closed. The enable relay B is closed in a zero current condition thus reducing/preventing arc-flash welding of the contacts of enable relay B.

Third, the logic card D closes one of the active SCRs (e.g., one of SCR F1 or I1) in a controlled manner to test for ground faults while maintaining the other active SCR open (e.g., the other of SCR F1 and I1). This test for ground faults can be done with escalating partial half waves to limit potential current peaks if a ground fault exists while still testing with full AC mains voltage. For example, SCR F1 may be fired to provide successive test pulses of increasing magnitude (e.g., successive ¼ positive half wave, ½ positive half wave, ¾ positive half wave, and full positive half wave test pulses) while maintaining active SCRs I1 and inactive SCRs F2 and I2 open. If significant current is detected at current detector E or at current detector J during any of the test pulses (indicating a ground fault), the cycle is aborted. In an alternative, SCRs F1 and I1 may be fired synchronously to provide successive test pulses, with current detector J being used to identify current imbalances across the AC power mains phases that are indicative of ground faults. By providing successive test pulses of increasing magnitude/duration, a ground fault may be detected without applying a full positive half wave test pulse.

Fourth, a standard firing sequence of switching pulses is run through using the active SCRs (e.g., F1 and I1). On completion of the firing sequence, both active SCR's will be open and no current will be flowing. In some embodiments, the initial pulses of the firing sequence may be partial half waves to reduce/limit potential current peaks if a short circuit condition should exist.

Fifth, the enable relay B is opened under a zero current condition (after opening both of the active SCRs).

While executing the switching cycle firing sequence of switching pulses, logic board D also performs the following operations:

The ground-fault detector J (e.g., a current detector with both AC mains power lines of the controller running therethrough) is coupled/linked to an emergency interrupt on the logic card D that is connected to the shunt-trip module on the magneto-thermal supplementary breaker K to provide rapid/instantaneous detach of the control from AC mains power supply in the event of a ground fault. Stated in other words, detector J may generate a ground fault signal responsive to detecting a ground fault, logic card D may transmit a shunt trip signal to breaker K responsive to the ground fault signal, and breaker K may open responsive to the shunt trip signal to provide disconnection from the AC mains power supply.

Logic card D measures (e.g., continuously measures) voltage on the coil side of the enable relay B, and if voltage is detected when it should not be present, logic card D transmits a shunt trip signal to the shunt-trip module on the magneto-thermal supplementary breaker K to provide rapid/instantaneous detach/disconnection from AC mains power supply.

Current detector E provides measurements (e.g., continuous measurements) of current flow through one of the active SCRs to logic card D. In the event that current flow is detected when no current should be flowing (e.g., between SCR+enable pulses), logic card D transmits a shunt trip signal to the shunt-trip module on the magneto-thermal supplementary breaker K to provide rapid/instantaneous detach/disconnection from AC mains power supply.

The coil resistance may be measured before starting the firing sequence, during initial pulses of the firing sequence, and/or throughout the firing sequence. Initial partial half wave test pulses may be transmitted through the coil through the active SCRs (e.g., F1 and I1), and current/voltage measurements may be used to determine the coil resistance. If an incorrect resistance is found, logic card D transmits a shunt trip signal to the shunt-trip module on the magneto-thermal supplementary breaker K to provide rapid/instantaneous detach/disconnection from the AC mains power supply.

Logic card D may also measure peak current pulse by pulse (using current detector E). If a potentially damaging current is detected, logic card D transmits a shunt trip signal to the shunt-trip module on the magneto-thermal supplementary breaker K to provide rapid/instantaneous detach/disconnection from the AC mains power supply.

According to embodiments of some inventive concepts, the firing sequence is controlled using two SCRs, one on the positive line and one on the common line. In embodiments of FIGS. 7A-C, SCRs F1 and I1 are used on the positive and common lines (responsive to SCR+enable pulses) to switch module H to a first state using positive half wave switching pulses (with SCRs F2 and I2 remaining open/inactive), and SCRs F2 and I2 are used on the positive and common lines (responsive to SCR−enable pulses) to switch module H to a second state different than the first state using negative half wave switching pulses (with SCRs F1 and I1 remaining open/inactive).

In addition, a single test pulse (or an escalating multi-pulse test) for ground fault and output short-circuit under full AC mains voltage may be conducted prior to initiating the firing sequence.

Rapid/instantaneous ground fault protection may be provided throughout the firing cycle using detector J.

Breaker K (e.g., a magneto-thermic supplementary breaker with shunt-trip function) may provide active rapid/instantaneous detach/disconnection from the AC mains power supply in the event of damage to components inside controller 701.

Breaker K may also provide rapid/instantaneous detach/disconnection from the AC mains power supply in the event of a dangerous output condition (e.g., unauthorized voltage on discharge cable or unauthorized current flow) responsive to a shunt trip signal from logic card D.

Figure 9:
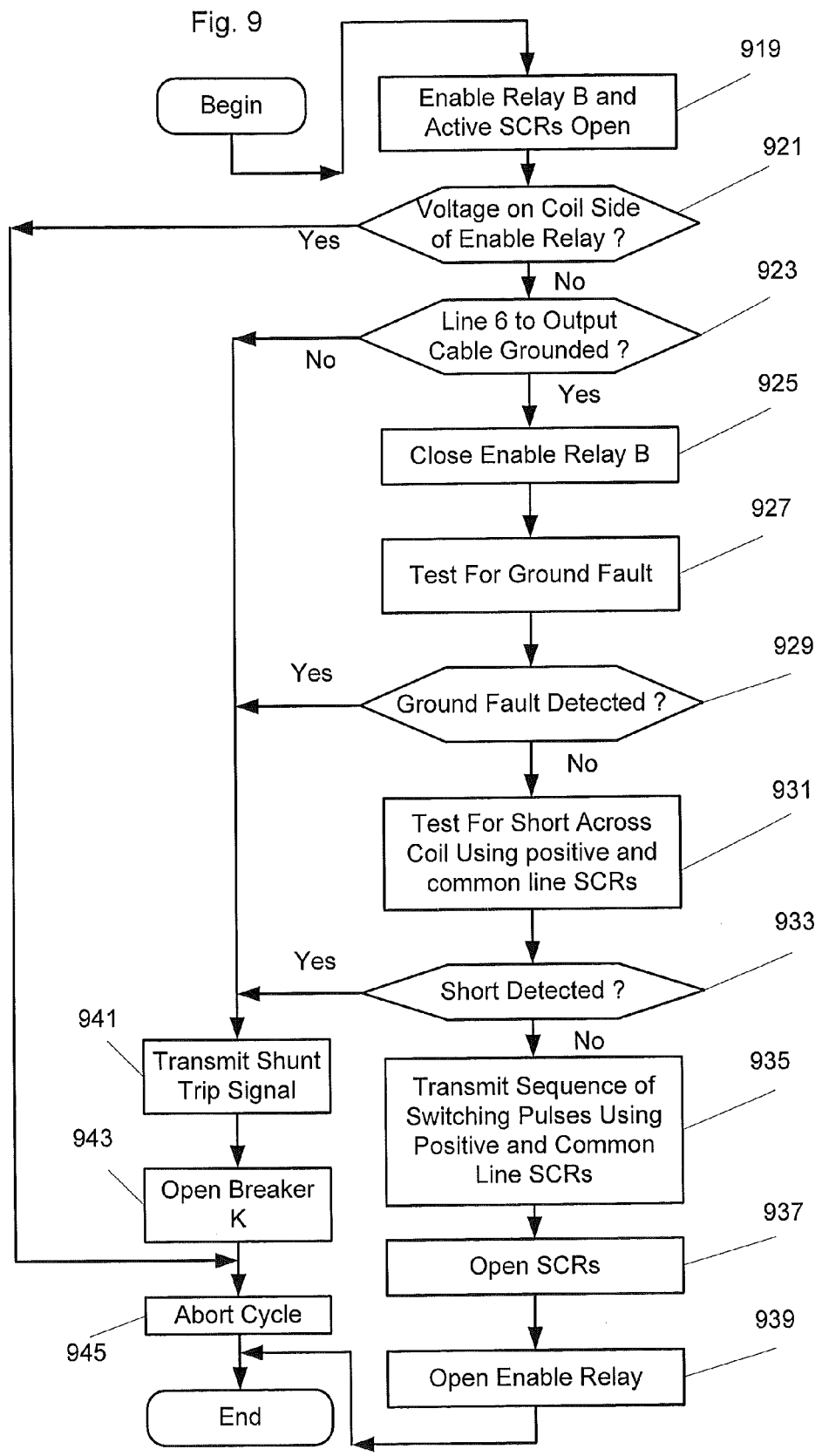
FIGS. 9, 10, and 11 are flow charts illustrating operations of controllers of FIGS. 7A, 7B, and 7C according to some embodiments.

Operations of controller 701 are illustrated in the flow chart of FIG. 9. As discussed above with respect to FIG. 3B, processor D (also referred to as a logic card) may initiate a magnetic switching operation responsive to a high logic level of the "cycle start" signal. At block 919, enable relay B and semiconductor switches F and I (including SCRs F1 and F2 and I1 and I2) are initially all open blocking current/voltage from the AC mains power source S to module H. At block 921, voltage on the SCR/coil side of enable relay B is checked, and if it exceeds a threshold, processor D aborts the magnetic switching operation at block 945, and processor D may open breaker K.

Logic card D also checks that line 6 to output cable G is grounded to verify that the cable G is properly attached to controller 701. If line 6 is not grounded, processor D transmits a shunt trip signal to breaker K at block 941 to open breaker K at block 943 and aborts the magnetic switching operation at block 945. In an alternative, processor D may abort the magnetic switching operation at block 945 without opening breaker K.

If the voltage on the SCR/coil side of enable relay B is below the threshold and line 6 is grounded at blocks 921 and 923, processor D closes enable relay B at block 925 (e.g., using the "enable closed" signal of FIG. 3C) with both semiconductor switches F and I open. Accordingly, enable relay B is closed in a no current condition, and AC mains power supply voltage and current are blocked from cable B by semiconductor switches F and I.

At block 927, logic card D tests for ground faults on cable G and/or module H using one of the semiconductor switches F or I while maintaining the other semiconductor switch closed. If any significant current is detected through either of detectors E and/or J, the ground fault test fails. If no significant current is detected through either of detectors E and/or I, the ground fault test passes. More particularly, turning one of the semiconductor switches on may include pulsing SCR F1 to provide a plurality of successive voltage pulses of increasing duration through semiconductor switch F while maintaining SCRs F2, I1, and I2 off. The successive voltage pulses may be a ¼ positive half wave test pulse as a first test pulse, a ½ positive half wave test pulse as a second test pulse, a ¾ positive half wave test pulse as a third pulse, and a full positive half wave test pulse as fourth test pulse, so that a ground fault may be detected with less than a full positive wave pulse. According to some other embodiments, both semiconductor switches F and I may be pulsed (e.g., using ¼ positive half wave, ¼ positive half wave, ¾ positive half wave, and full positive half wave test pulses) to provide successive current pulses through the coil, and detection of a current balance across the AC mains power lines using current detector J may indicate a ground fault. Because some imbalance may be inherent when using 2 lines of a three-phase power source, a threshold current/imbalance may be used to determine a ground fault. Stated in other words, detection of a current/imbalance greater than zero may be required to indicate a ground fault.

Responsive to failing ground fault detection at block 929, processor D transmits a shunt trip signal to breaker K at block 941 to open breaker K at block 943 and aborts the magnetic switching operation at block 945. Responsive to passing ground fault detection at block 929, processor D may proceed with a test for shorts across the coil (e.g., across outputs of semiconductor switches F and I at lines +1 and −5) at block 931.

At block 931, processor D transmits SCR enable signals to both semiconductor switches F and I for at least one test pulse having a duration (e.g., ¼ of a half wave pulse) that is less than a switching pulse (e.g., a half wave pulse) used to switch a magnetic state of module H to thereby electrically couple both positive and common lines +1 and −5 of cable G to respective lines of the AC mains power source during the test pulse. For example, SCRs F1 and I1 may be turned on for the at least one test pulse (providing a positive test pulse) while maintaining SCRs F2 and I2 off, or SCRs F2 and I2 may be turned on for the at least one test pulse (providing a negative test pulse) while maintaining SCRs F1 and I1 off. More particularly, processor D may transmit SCR enable signals to both semiconductor switches F and I for a plurality of test pulses of increasing duration (e.g., a first ¼ of a half wave test pulse, a second ½ of a half wave test pulse, a third ¾ of a half wave test pulse, and a fourth full half wave test pulse).

If a resulting current through the semiconductor switches (e.g., as measured at current detector E) during the test pulse exceeds a short circuit threshold at block 933 (indicating a short between positive and common lines +1 and −1 of cable G), processor D transmits a shunt trip signal to breaker K at block 941 to open breaker K at block 943 and aborts the magnetic switching operation at block 945. Responsive to passing short circuit detection at block 933, processor D may proceed with the firing sequence by controlling semiconductor switches F and I to transmit a sequence of switching pulses (e.g., using positive and common SCRs F1 and I1 for positive half wave switching pulses, or using positive and common SCRs F2 and I2 for negative half wave switching pulses) at block 935 to change a magnetic state of module H.

According to some embodiments, operations of blocks 927, 929, 931, and 933, may be combined. If ground fault testing of block 927 is performed by pulsing both semiconductor switches F and I, for example, the same pulses may be used to detect ground faults (based on current imbalance at current detector J) and shorts across the coil (based on excessive current at current detector E).

Once the sequence of switching pulses is complete at block 935, processor D may open semiconductor switches F and I at block 937 (e.g., turning off all SCRs including active SCRs used during the sequence and inactive SCRs) by providing logic low level SCR+/−signals as shown in FIG. 3E. Once the semiconductor switches F and I have been turned off so that no current is flowing through enable relay B, enable relay B may be opened in a no current situation responsive to a low logic level of an enable closed signal as shown in FIG. 3C. Operations of FIG. 9 may be performed using SCRs F1 and I1 as active SCRs to provide positive voltage pulses to switch module H to a first magnetic state (e.g., a magnetized on state) while SCRs F2 and I2 are maintained off as inactive SCRs. In contrast, Operations of FIG. 9 may be performed using SCRs F2 and I2 as active SCRs to provide negative voltage pulses to switch module H to a second magnetic state (e.g., a de-magnetized off state) while SCRs F1 and I1 are maintained off as inactive SCRs.

Figure 10:
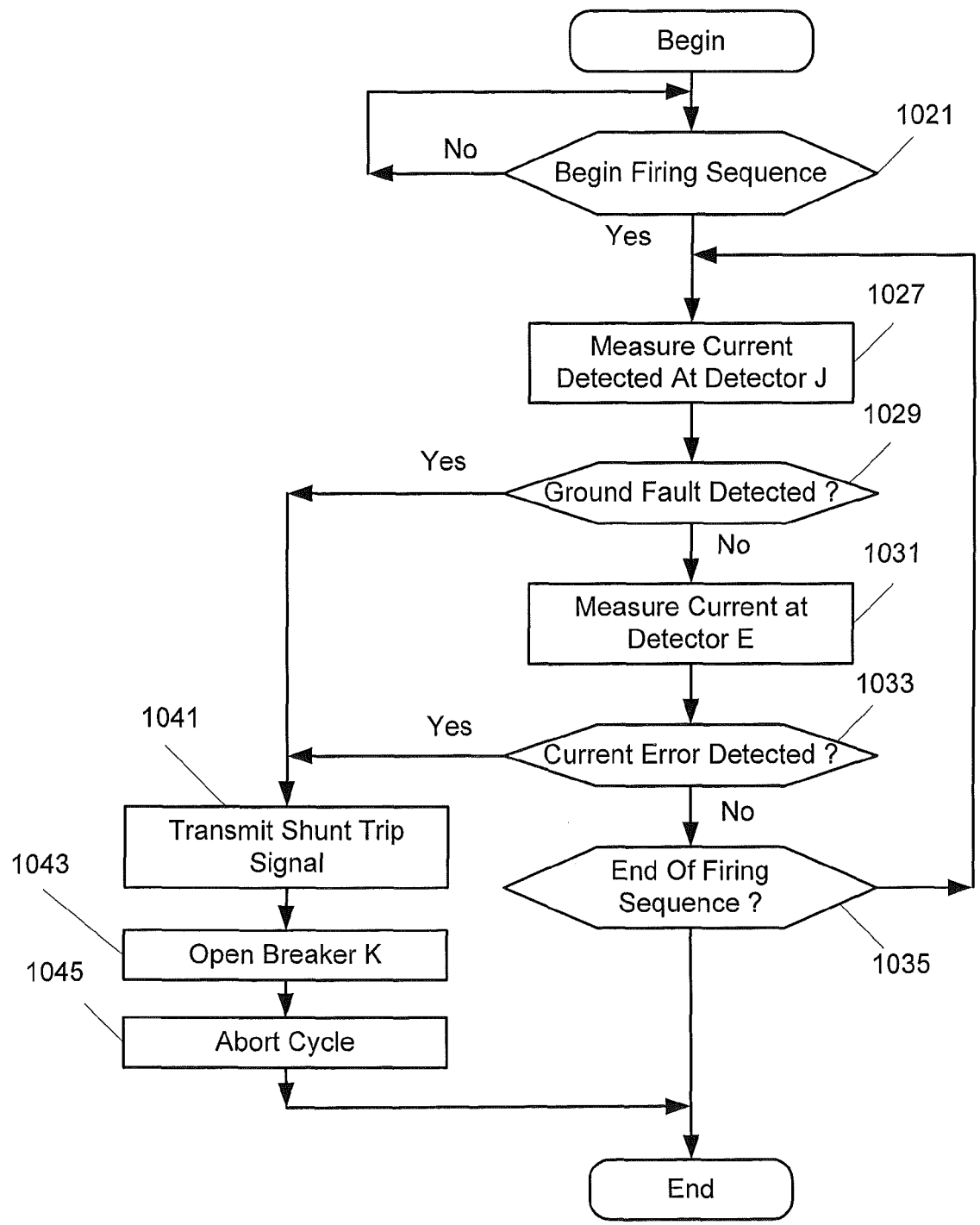

While transmitting the sequence of switching pulses at block 935 of FIG. 9, processor D may perform operations of FIG. 10 to monitor for fault conditions and take protective action if needed.

Once the firing sequence is initiated at block 1021, processor D may monitor (or continue monitoring) for an imbalance of current between first and second power lines of controller 701 using current detector J at block 1027. As long as the currents of the two power lines through detector J are balanced, low/no current will be detected by detector J. If a ground fault occurs, however, currents of the power lines through detector J may become imbalanced, and detector J will notify processor D of the detected imbalance (e.g., when a current detected by detector J exceeds a threshold current that may be greater than 0 magnitude). Responsive to notification of the imbalance (indicating a ground fault) at block 1029, processor D transmits a shunt trip signal to breaker K at block 1041 to open breaker K at block 1043 and aborts the magnetic switching operation at block 1045.

Once the firing sequence is initiated at block 1021, processor D may also monitor (or continue monitoring) current through one or both of semiconductor switches F and/or I at block 1031, for example, using current detector E. If a current error is detected at block 1033, processor D transmits a shunt trip signal to breaker K at block 1041 to open breaker K at block 1043 and aborts the magnetic switching operation at block 1045. A current error may be detected, for example, if a current through detector E exceeds an off state error threshold between pulses (indicating a failure of a semiconductor switch or switches F/I), and/or if a current through detector E exceeds an on state error threshold (indicating a short between positive and common lines +1 and −5 of cable G) during or between pulses. If a current error is detected at block 1033, processor D transmits a shunt trip signal to breaker K at block 1041 to open breaker K at block 1043 and aborts the magnetic switching operation at block 1045.

As long as no errors/failures are detected at any of blocks 1029, and/or 1033, processor D and controller 701 may continue to the end of the firing sequence at block 1035, but any detected error/failure may result in a rapid/instantaneous opening of breaker K (responsive to a shunt trip signal generated by processor D) and aborting the firing sequence at blocks 1041, 1043, and 1045. These operations of blocks 1041, 1043, and 1045 may happen rapidly (e.g., within a time less than the duration of a half wave of the AC mains power) to reduce damage to the controller 701, module H, and/or the surrounding environment, and/or to reduce injury. While operations of FIG. 10 are shown sequentially for purposes of illustration, measuring/monitoring operations of blocks 1029 and/or 1033 may occur in parallel (e.g., simultaneously and/or continuously) during the firing sequence.

Figure 8:
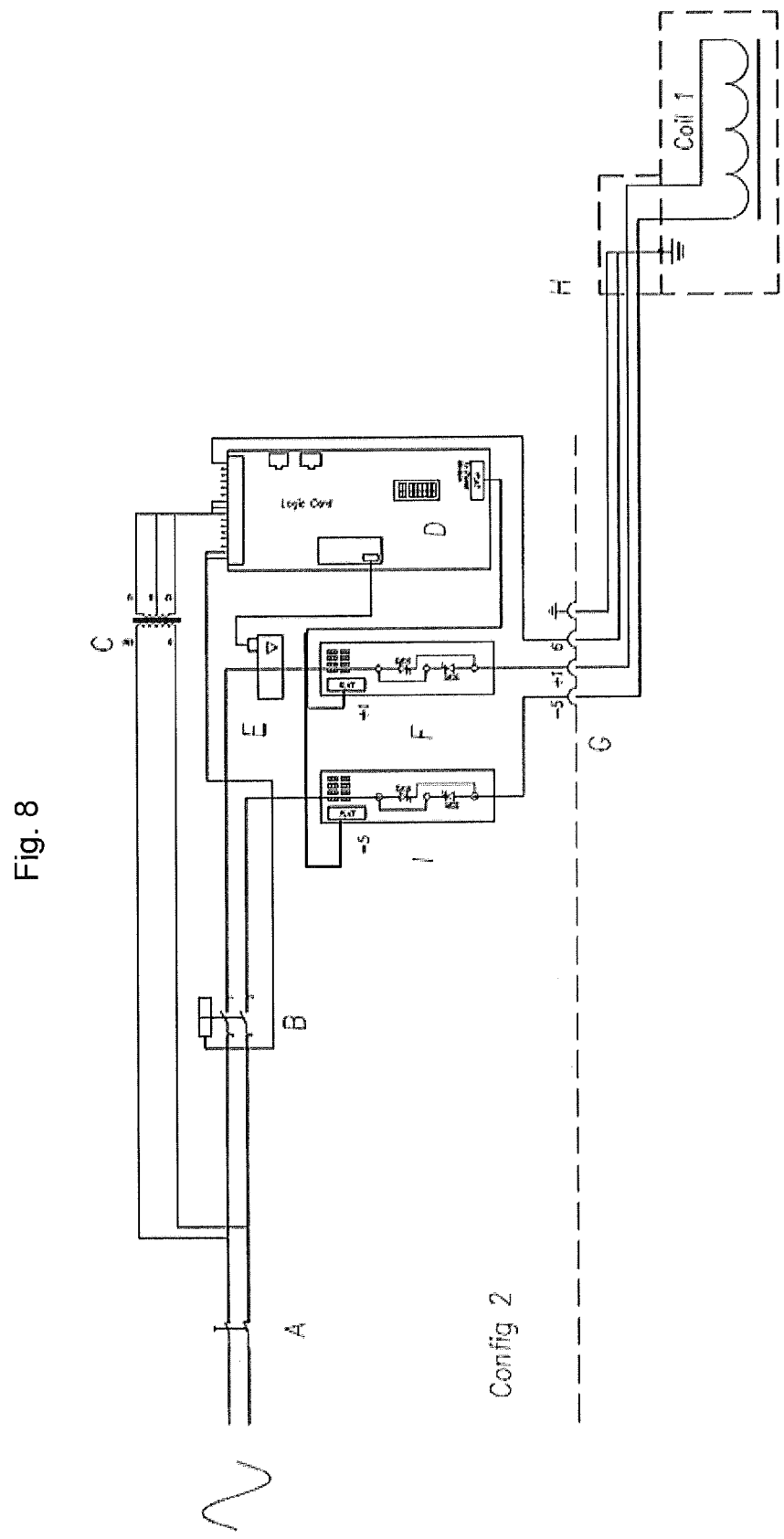
FIG. 8 is a schematic diagram illustrating elements of controllers for electro-permanent magnetic devices according to some embodiments.

FIG. 8 is a schematic diagram illustrating a controller according to some other embodiments of inventive concepts. The controller of FIG. 8 is similar to that of FIGS. 7A-C with the omission of current detector J and breaker K. Operations of the controller of FIG. 8 may thus be similar to those discussed above with respect to the flow charts of FIGS. 9 and 10 with the omission of blocks 941 and 943 of FIG. 9 and blocks 1027, 1029, 1041, and 1043 of FIG. 10.

According to some other embodiments of FIG. 8, a mechanical switch (e.g., en electromechanical relay switch, also referred to as a relay) may be substituted for semiconductor switch I. During operations of blocks 919, 921, 923, and 925, the mechanical switch I and the semiconductor switch F are maintained open so that both phases of AC mains power are decoupled from cable G. During operations of blocks 927 and 929, mechanical switch I may be maintained open while semiconductor switch F is pulsed to test for ground faults using current detector E. During operations of blocks 931 and 933, mechanical switch I may be closed before initiating current pulses and maintained closed while current is pulsed under control of semiconductor switch F to test for shorts across the coil using current detector F. During operations of block 935, mechanical switch I may be closed before initiating current pulses and maintained closed while current is pulsed under control of semiconductor switch F to change a magnetic state of module H. At block 937, mechanical switch I may be opened after terminating switching of semiconductor switch F. During operations of FIG. 10, mechanical switch I may be maintained closed until after current has been blocked by semiconductor switch F at block 1035 and/or 1045.

Figure 11:
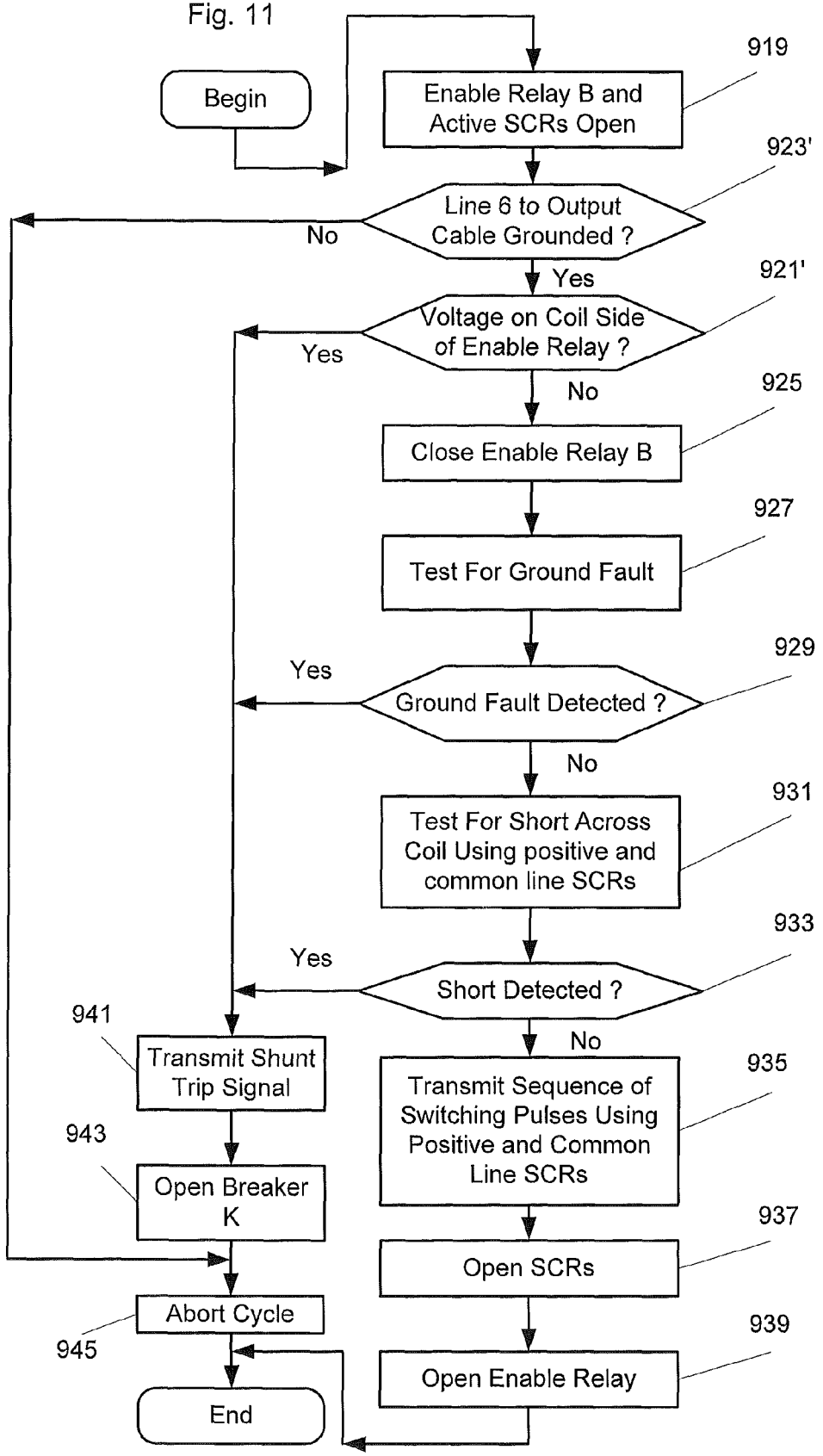

FIG. 11 is a flow chart illustrating operations of controller 701 provided as an alternative to operations of FIG. 9. As shown in FIG. 11, an order of operations of blocks 921 and 923 of FIG. 9 may be reversed as indicated by blocks 923' and 921' of FIG. 11. Otherwise, operations of blocks 919, 925, 927, 929, 931, 933, 935, 937, 939, 941, 943, and 945 may be the same as or substantially the same as discussed above with respect to FIG. 9.

As discussed above with respect to FIG. 9, processor D (also referred to as a logic card) may initiate a magnetic switching operation responsive to a high logic level of the "cycle start" signal. At block 919, enable relay B and semiconductor switches F and I (including SCRs F1 and F2 and I1 and I2) are initially all open blocking current/voltage from the AC mains power source S to module H.

At block 923', processor D checks that line 6 to output cable G is grounded to verify that the cable G is properly attached to controller 701. If line 6 is not grounded, processor D aborts the magnetic switching operation at block 945 without opening breaker K. In an alternative, processor D may transmit a shunt trip signal at block 941, open breaker K at block 943, and abort the magnetic switching operations at block 945 responsive to line 6 not being grounded.

At block 921', voltage on the SCR/coil side of enable relay B is checked with enable relay B open, and if it exceeds a threshold, processor D transmits a shunt trip signal to breaker K at block 941 to open breaker K at block 943 and aborts the magnetic switching operation at block 945. If line 6 is grounded at block 923' and if a voltage on the SCR/coil side of enable relay B does not exceed the threshold at block 921', processor D may proceed with operations of blocks 925, 927, 929, 931, 933, 935, 937, 939, 941, 943, and 945 as discussed above with respect to FIG. 9.

In the above-description of various embodiments of present inventive concepts, it is to be understood that the terminology used herein is for the purpose of describing particular embodiments only and is not intended to be limiting of inventive concepts. Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When an element is referred to as being "connected", "coupled", "responsive", or variants thereof to another element, it can be directly connected, coupled, or responsive to the other element or intervening elements may be present. In contrast, when an element is referred to as being "directly connected", "directly coupled", "directly responsive", or variants thereof to another element, there are no intervening elements present. Like numbers refer to like elements throughout. Furthermore, "coupled", "connected", "responsive", or variants thereof as used herein may include wirelessly coupled, connected, or responsive. As used herein, the singular forms "a", "an" and "the" are intended to include the plural forms as well, unless the context clearly indicates otherwise. Well-known functions or constructions may not be described in detail for brevity and/or clarity. The term "and/or" includes any and all combinations of one or more of the associated listed items.

As used herein, the terms "comprise", "comprising", "comprises", "include", "including", "includes", "have", "has", "having", or variants thereof are open-ended, and include one or more stated features, integers, elements, steps, components or functions but do not preclude the presence or addition of one or more other features, integers, elements, steps, components, functions or groups thereof. Furthermore, as used herein, the common abbreviation "e.g.", which derives from the Latin phrase "exempli gratia," may be used to introduce or specify a general example or examples of a previously mentioned item, and is not intended to be limiting of such item. The common abbreviation "i.e.", which derives from the Latin phrase "id est," may be used to specify a particular item from a more general recitation.

Example embodiments are described herein with reference to block diagrams and/or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by one or more computer circuits. These computer program instructions may be provided to a processor circuit (also referred to as a processor) of a general purpose computer circuit, special purpose computer circuit, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s). Processor functionality discussed herein, for example, may thus be performed using one or more computer circuits implemented using one or more microprocessors, logic elements, memory elements, circuit boards, logic cards, etc.

These computer program instructions may also be stored in a tangible computer-readable medium that can direct a computer or other programmable data processing apparatus to function in a particular manner, such that the instructions stored in the computer-readable medium produce an article of manufacture including instructions which implement the functions/acts specified in the block diagrams and/or flowchart block or blocks.

A tangible, non-transitory computer-readable medium may include an electronic, magnetic, optical, electromagnetic, or semiconductor data storage system, apparatus, or device. More specific examples of the computer-readable medium would include the following: a portable computer diskette, a random access memory (RAM) circuit, a read-only memory (ROM) circuit, an erasable programmable read-only memory (EPROM or Flash memory) circuit, a portable compact disc read-only memory (CD-ROM), and a portable digital video disc read-only memory (DVD/BlueRay).

The computer program instructions may also be loaded onto a computer and/or other programmable data processing apparatus to cause a series of operational steps to be performed on the computer and/or other programmable apparatus to produce a computer-implemented process such that the instructions which execute on the computer or other programmable apparatus provide steps for implementing the functions/acts specified in the block diagrams and/or flowchart block or blocks. Accordingly, embodiments of inventive concepts may be embodied in hardware and/or in software (including firmware, resident software, microcode, etc.) that runs on a processor such as a digital signal processor, which may collectively be referred to as "circuitry," "a module" or variants thereof.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of inventive concepts. Moreover, although some of the diagrams include arrows on communication paths to show a primary direction of communication, it is to be understood that communication may occur in the opposite direction to the depicted arrows.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of various example combinations and subcombinations of embodiments and of the manner and process of making and using them, and shall support claims to any such combination or subcombination.

Many variations and modifications can be made to the embodiments without substantially departing from the principles of present inventive concepts. All such variations and modifications are intended to be included herein within the scope of present inventive concepts. Accordingly, the above disclosed subject matter is to be considered illustrative, and not restrictive, and the appended claims are intended to cover all such modifications, enhancements, and other embodiments, which fall within the spirit and scope of present inventive concepts.

That which is claimed is:

1. A method of controlling an electro-permanent magnetic device powered from an AC mains power source provided through first and second power lines of a controller, wherein a first switch is provided on the first power line between the AC mains power source and the electro-permanent magnetic device and a second switch is provided on the second power line between the AC main power source and the electro-permanent magnetic device, the method comprising:
   transmitting a sequence of switching pulses through the first and second switches to change a magnetic state of the electro-permanent magnetic device.

2. The method of claim 1 wherein the first switch comprises a first semiconductor switch.

3. The method of claim 1 further comprising:
   before transmitting the sequence of switching pulses, turning on the first and second switches for at least one test pulse to test for a short circuit between outputs of the first and second switches;
   wherein transmitting the sequence of switching pulses through the first and second switches comprises transmitting the sequence of pulses responsive to the test indicating an absence of short circuits.

4. The method to claim 3 wherein turning the first and second switches on for at least one test pulse comprises turning the first switch on for a plurality of test pulses of increasing duration.

5. The method of claim 3 further comprising:
responsive to the test indicating a presence of a short circuit, opening a breaker between the AC mains voltage source and each of the first and second switches, and aborting the switching pulses.

6. The method of claim 1 further comprising:
before transmitting the sequence of switching pulses, opening a relay between the AC mains power supply and the first and second switches;
before transmitting the sequence of switching pulses, checking for an absence of voltage on a coil side of the relay while the relay is open; and
before transmitting the sequence of switching pulses, closing the relay responsive to checking for the absence of voltage on the coil side of the relay.

7. The method of claim 1 further comprising:
while transmitting the sequence of switching pulses, monitoring for an imbalance of current between the first and second power lines of the controller; and
responsive to detecting a imbalance of current, opening a breaker between the AC mains voltage source and each of the first and second switches, and aborting the switching pulses.

8. The method of claim 1 further comprising:
while transmitting the sequence of switching pulses, monitoring for current through one of the first and second power lines of the controller between switching pulses; and
responsive to detecting current between switching pulses, opening a breaker between the AC mains voltage source and each of the first and second switches, and aborting the switching pulses.

9. The method of claim 1 wherein one of the first and second power lines of the controller is a common voltage line and the other of the first and second voltage lines is a positive voltage line.

10. The method of claim 1 wherein the first switch comprises a first semiconductor controlled rectifier.

11. The method of claim 10 wherein the second switch comprises a second semiconductor controlled rectifier.

12. The method of claim 1 wherein the first switch comprises a first positive semiconductor controlled rectifier for positive pulses and a first negative semiconductor controlled rectifier for negative pulses, and wherein the first positive semiconductor controlled rectifier and the first negative semiconductor controlled rectifier are electrically coupled in parallel on the first power line.

13. The method of claim 12 wherein the second switch comprises a second positive semiconductor controlled rectifier for positive pulses and a second negative semiconductor controlled rectifier pulse for negative pulses, and wherein the second positive semiconductor controlled rectifier and the second negative semiconductor controlled rectifier are electrically coupled in parallel on the second power line.

14. The method of claim 1 further comprising:
before transmitting the sequence of switching pulses, turning the first switch on to test the for a ground fault;
wherein transmitting the sequence of switching pulses through the first and second switches comprises transmitting the sequence of switching pulses responsive to the test indicating an absence of ground faults.

15. The method of claim 14 wherein turning the first switch on to test for a ground fault comprises turning the first switch on to test for the ground fault while maintaining the second switch off.

16. The method of claim 14 wherein turning the first switch on comprises pulsing the first switch to provide a plurality of successive voltage test pulses of increasing duration, through the first switch.

17. The method of claim 14 further comprising:
responsive to the test indicating the presence of a ground fault, opening a breaker between the AC mains voltage source and each of the first and second switches, and aborting the switching pulses.

18. The method of claim 1, wherein the electro-permanent magnet includes a switching magnet and a coil, wherein the sequence of switching pulses are transmitted through the first and second switches and through the coil to change a magnetic state of the switching magnet to a new magnetic state such that the new magnetic state of the switching magnet is maintained after terminating the sequence of switching pulses.

19. A controller for an electro-permanent magnetic device powered from an AC mains power source, the controller comprising:
first and second power lines;
a first switch on the first power line between the AC mains power source and the electro-permanent magnetic device;
a second switch on the second power line between the AC mains power source and the electro-permanent magnetic device; and
a processor coupled to the first and second switches, wherein the processor is configured to control the first and second switches so that a sequence of switching pulses is transmitted through the first and second switches to change a magnetic state of the electro-permanent magnetic device.

20. The controller of claim 19 wherein the first switch comprises a first semiconductor controlled rectifier.

21. The controller of claim 20 wherein the second switch comprises a second semiconductor controlled rectifier.

22. The controller of claim 19 wherein the first switch comprises a first positive semiconductor controlled rectifier for positive pulses and a first negative semiconductor controlled rectifier for negative pulses, and wherein the first positive semiconductor controlled rectifier and the first negative semiconductor controlled rectifier are electrically coupled in parallel on the first power line.

23. The controller of claim 22 wherein the second switch comprises a second positive semiconductor controlled rectifier for positive pulses and a second negative semiconductor controlled rectifier pulse for negative pulses, and wherein the second positive semiconductor controlled rectifier and the second negative semiconductor controlled rectifier are electrically coupled in parallel on the first power line.

24. The controller of claim 19 wherein the processor is further configured to control the first and second switches to turn on the first and second switches for at least one test pulse before transmitting the sequence of switching pulses to test for a short circuit between outputs of the first and second switches, and wherein the processor is further configured to control the first and second switches to transmit the sequence of switching pulses through the first and second switches responsive to the test indicating an absence of short circuits.

25. The controller of claim 24 wherein the processor is further configured to turn the first and second switches on for at least one test pulse by turning the first switch on for a plurality of test pulses of increasing duration.

26. The controller of claim 24 further comprising:
a breaker between the AC mains voltage source and each of the first and second switches,
wherein the processor is further configured to open the breaker and abort the switching pulses responsive to the test indicating a presence of a short circuit.

27. The controller of claim 19 further comprising:
a relay between the AC mains power supply and the first and second switches,
wherein the processor is further configured to open the relay before transmitting the sequence of switching pulses, to check for an absence of voltage on a coil side of the relay while the relay is open before transmitting the sequence of switching pulses, and to close the relay responsive to checking for the absence of voltage on the coil side of the relay before transmitting the sequence of switching pulses.

28. The controller of claim 19 further comprising:
a breaker between the AC mains voltage source and each of the first and second switches,
wherein the processor is further configured to monitor for an imbalance of current between the first and second power lines of the controller, and to open the breaker and abort the switching pulses responsive to detecting an imbalance of current.

29. The controller of claim 19 further comprising:
a breaker between the AC mains voltage source and each of the first and second switches,
wherein the processor is further configured to monitor for current through one of the first and second power lines of the controller between switching pulses while transmitting the sequence of switching pulses, and to open a breaker between the AC mains voltage source and each of the first and second switches and abort the switching pulses responsive to detecting current between switching pulses.

30. The controller of claim 19 wherein one of the first and second power lines of the controller is a common voltage line and the other of the first and second voltage lines is a positive voltage line.

31. The controller of claim 19 wherein the processor is further configured to turn the first switch on to test the for a ground fault before transmitting the sequence of switching pulses, and wherein the processor is configured to control the first and second switches to transmit the sequence of switching pulses responsive to the test indicating an absence of ground faults.

32. The controller of claim 31 wherein the processor is configured to turn the first switch on to test for a ground fault by turning the first switch on to test for the ground fault while maintaining the second switch off.

33. The controller of claim 31 wherein the processor is configured to turn the first switch on by pulsing the first, switch to provide a plurality of successive test pulses of increasing duration through the first switch.

34. The controller of claim 31 further comprising:
a breaker between the AC mains voltage source and each of the first and second switches,
wherein the processor is configured to open the breaker and abort the switching pulses responsive to the test indicating the presence of a ground fault.

35. The method of claim 19, wherein the electro-permanent magnet includes a switching magnet and a coil, wherein the sequence of switching pulses are transmitted through the first and second switches and through the coil to change a magnetic state of the switching magnet to a new magnetic state such that the new magnetic state of the switching magnet is maintained after terminating the sequence of switching pulses.

* * * * *